US012677642B2

(12) United States Patent
Choo et al.

(10) Patent No.: US 12,677,642 B2
(45) Date of Patent: Jul. 7, 2026

(54) SEMICONDUCTOR DEVICE

(71) Applicant: Samsung Electronics Co., Ltd.,
Suwon-si (KR)

(72) Inventors: Gyosoo Choo, Suwon-si (KR);
Daeseok Byeon, Suwon-si (KR);
Woosung Yang, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 480 days.

(21) Appl. No.: 18/331,975

(22) Filed: Jun. 9, 2023

(65) Prior Publication Data

US 2024/0128135 A1      Apr. 18, 2024

(30) Foreign Application Priority Data

Oct. 13, 2022      (KR) ......................... 10-2022-0131563

(51) Int. Cl.
| | |
|---|---|
| *H01L 23/58* | (2006.01) |
| *H01L 29/10* | (2006.01) |
| *H10P 74/00* | (2026.01) |

(Continued)

(52) U.S. Cl.
CPC .......... *H10P 74/277* (2026.01); *H10P 74/207* (2026.01); *H10W 46/00* (2026.01);
(Continued)

(58) Field of Classification Search
CPC ....... H01L 22/34; H01L 22/14; H01L 23/544;
H01L 24/08; H01L 25/0657; H01L
2224/08148; H01L 2225/06565; H01L
2924/1438; H01L 2924/35121; H01L
22/32; H01L 21/78; H01L 23/585; H01L 22/12; H01L 25/18; H01L 2224/80895;
H01L 2224/80896; H01L 23/564; H01L
24/48; H01L 2224/06515; H01L
2224/09515; H01L 2225/06513; H01L
2225/06527; H01L 2225/06544; H01L
24/06; H01L 24/09; H01L 21/561; H01L
21/76898; H01L 22/20; H01L 23/3114;
(Continued)

(56) References Cited

U.S. PATENT DOCUMENTS

| | | |
|---|---|---|
| 5,903,489 A | 5/1999 | Hayano |
| 10,991,743 B2 | 4/2021 | Iwafuchi |

(Continued)

FOREIGN PATENT DOCUMENTS

| | | |
|---|---|---|
| JP | H03001439 U | 1/1991 |
| JP | 2015185683 A | 10/2015 |

OTHER PUBLICATIONS

Extended European Search Report corresponding to EP 23191624.
8; Dated Feb. 13, 2024, (11 pages).

*Primary Examiner* — Niki H Nguyen
(74) *Attorney, Agent, or Firm* — Wolf, Greenfield &
Sacks, P.C.

(57) ABSTRACT

A semiconductor device with a structure in which a plurality
of chips are stacked includes: a chip area; a scribe lane at a
circumference of the chip area; a dam structure that sepa-
rates the chip area and the scribe lane; a detection wire that
extends from the chip area to the scribe lane by passing
through the dam structure; and a detection circuit in the chip
area that is electrically connected to the detection wire and
is configured to detect a defect in the scribe lane.

20 Claims, 12 Drawing Sheets

(51) Int. Cl.

| | |
|---|---|
| *H10P 74/20* | (2026.01) |
| *H10W 46/00* | (2026.01) |
| *H10W 90/00* | (2026.01) |
| *H10W 90/26* | (2026.01) |

(52) U.S. Cl.
CPC ............ *H10W 90/00* (2026.01); *H10W 90/26* (2026.01); *H10W 90/792* (2026.01)

(58) Field of Classification Search
CPC ............. H01L 2224/11; H01L 23/3128; H01L 23/315; H01L 23/3178; H01L 23/3185; H01L 23/481; H01L 23/562; H01L 2225/06541; H01L 2225/06596; H01L 23/535; H01L 24/80
See application file for complete search history.

(56) References Cited

U.S. PATENT DOCUMENTS

| | | | | |
|---|---|---|---|---|
| 11,105,846 | B1 | 8/2021 | Polomoff et al. | |
| 11,195,587 | B2 | 12/2021 | Son et al. | |
| 11,342,234 | B2 | 5/2022 | Kim et al. | |
| 2004/0150070 | A1 | 8/2004 | Okada et al. | |
| 2010/0117678 | A1 | 5/2010 | Nakabayashi | |
| 2015/0200146 | A1 | 7/2015 | Reber et al. | |
| 2020/0150174 | A1* | 5/2020 | Kumar | G01R 31/2884 |
| 2021/0257266 | A1 | 8/2021 | Oh | |
| 2022/0084859 | A1* | 3/2022 | Son | H10P 72/0616 |
| 2022/0108926 | A1 | 4/2022 | Pachamuthu et al. | |
| 2022/0336298 | A1* | 10/2022 | Kim | H10P 74/273 |

* cited by examiner

SEMICONDUCTOR DEVICE

CROSS-REFERENCE TO RELATED APPLICATION

This application claims priority to and the benefit of Korean Patent Application No. 10-2022-0131563 filed in the Korean Intellectual Property Office on Oct. 13, 2022, the entire contents of which are incorporated herein by reference.

BACKGROUND

(a) Field

The present disclosure relates to a semiconductor device. More specifically, the present disclosure relates to a semiconductor device that can detect defects before sawing a substrate.

(b) Description of the Related Art

A semiconductor device may be developed from a 3D cell structure to using a bonding VNAND structure that incorporates upper plate (Cell) and lower plate (Pericircuit) junctions using Cu. In bonding VNAND products, whether there is a junction between the upper plate and the lower plate is an important technology.

The bonding force between the upper plate and the lower plate can be improved as the bonding area is increased, but the competitiveness of the product may be, and thus, it is desirable to improve bonding while reducing the bonding area.

During a semiconductor package assembly process, during dicing from a wafer to individual chips, defects, such as peeling, often occur before and after sawing, and it is difficult to determine whether the defect occurs due to the sawing or due to a previous process.

Therefore, it is desirable to develop a technology that can determine whether there is a junction between the upper plate and the lower plate before sawing.

SUMMARY

One aspect of the inventive concept is to provide a semiconductor device that can detect a defect in a scribe lane.

A semiconductor device with a structure in which a plurality of chips are stacked according to an embodiment includes: a chip area; a scribe lane at a circumference of the chip area; a dam structure that separates the chip area and the scribe lane; a detection wire that extends from the chip area to the scribe lane by passing through the dam structure; and a detection circuit in the chip area that is electrically connected to the detection wire and is configured to detect a defect in the scribe lane.

The plurality of chips may include a first chip having a first bonding metal pattern, and a second chip on the first chip and including a second bonding metal pattern corresponding to the first bonding metal pattern. The first chip and the second chip are bonded together by bonding the first bonding metal pattern and the second bonding metal pattern to each other.

In the scribe lane, the detection wire may include the first bonding metal pattern and the second bonding metal pattern.

In the scribe lane, the detection wire may include first and second detection wire structures on the first and second chips, respectively, and first and second contact plugs that connect the first and second detection wire structures to the first and second bonding metal patterns, respectively.

The dam structure may include a through hole, and at least one of the first and second detection wire structures may extend from the chip area and may be connected to a connection wiring structure passing through the through hole.

The detection wire extending into the scribe lane at least partially surrounds the dam structure in a plan view.

The detection circuit may include a switch that is configurable to control connection to the detection wire.

Detection pads may be on one side and the other side of the detection wire, respectively.

The dam structure may include an inner dam adjacent to the chip area and surrounding the chip area in a plan view, and an outer dam spaced parallel to the inner dam and surrounding the inner dam in the plan view, the outer dam being between the inner dam and the scribe lane.

The inner dam may include a first through portion through which the detection line passes, and the outer dam may include a second through portion through which a detection line extending through the first through portion passes.

The inner dam and the outer dam may each have a rectangular ring shape, and at least one of the first through portion and the second through portion may be adjacent to one vertex of the rectangular ring shape.

The detection circuit portion may include a plurality of detection circuits, the detection wire may include a plurality of detection wires electrically separated from each other, and the plurality of detection circuits may be electrically connected to the plurality of detection wires, respectively.

The dam structure may have a square ring shape, the detection wire may include a plurality of detection wires passing through each corner side of the dam structure, and the plurality of detection wires may be electrically separated from each other.

A semiconductor device according to an embodiment includes: a chip area including a detection circuit portion; a scribe lane at a circumference of the chip area; and a detection wire that is electrically connected to the detection circuit portion, and extends from the chip area to the scribe lane.

The semiconductor device may further include at least one dam between the chip area and the scribe lane separating the chip area and the scribe lane, wherein the detection wire may include an extension portion extending along the scribe lane to surround the at least one dam in a plan view, and a connection portion passing through the at least one dam to connect the detection circuit portion and the extension portion.

The detection circuit portion may be configured to apply an input signal to the detection wire and may be configured to receive an output signal from the detection wire to detect a defect in the scribe lane.

The input signal may include a pulse, a signal, and/or a DC voltage.

The detection circuit portion may include a switch that is configurable to cut off an electrical connection with the detection wire, and the detection wire may include an input pad configured to apply an input signal and an output pad configured to output an output signal.

The scribe lane may include a lower structure including a first bonding metal pattern that is combined with an upper structure including a second bonding metal pattern corresponding to the first bonding metal pattern, and the detection wire may include the first bonding metal pattern and the second bonding metal pattern.

A semiconductor device bonded with a plurality of wafers according to an embodiment includes: a chip area; a scribe lane at a circumference of the chip area; a dam structure between the chip area and the scribe lane, and including an inner dam in the form of a first square ring surrounding the chip area in a plan view and an outer dam in the form of a second square ring spaced at a predetermined distance from the inner dam in the direction of the scribe lane; a detection wire extending from the chip area to the scribe lane through the dam structure; and a detection circuit portion in the chip area and electrically connected to the detection wire, wherein the detection circuit portion is configured to apply an input signal to the detection wire and is configured to detect a defect in the scribe lane using an output signal received through the detection wire; and a first through portion through which the detection wire passes in the inner dam and a second through portion through which the detection wire passes in the outer dam, the first through portion and the second through portion are on opposite corner sides of the first and second square rings, respectively.

According to the embodiments, defects such as cracks generated prior to sawing of the substrate may be detected.

In addition, defects such as bonding, layer, and contact of the scribe lane can be detected.

DETAILED DESCRIPTION

Figure 1:
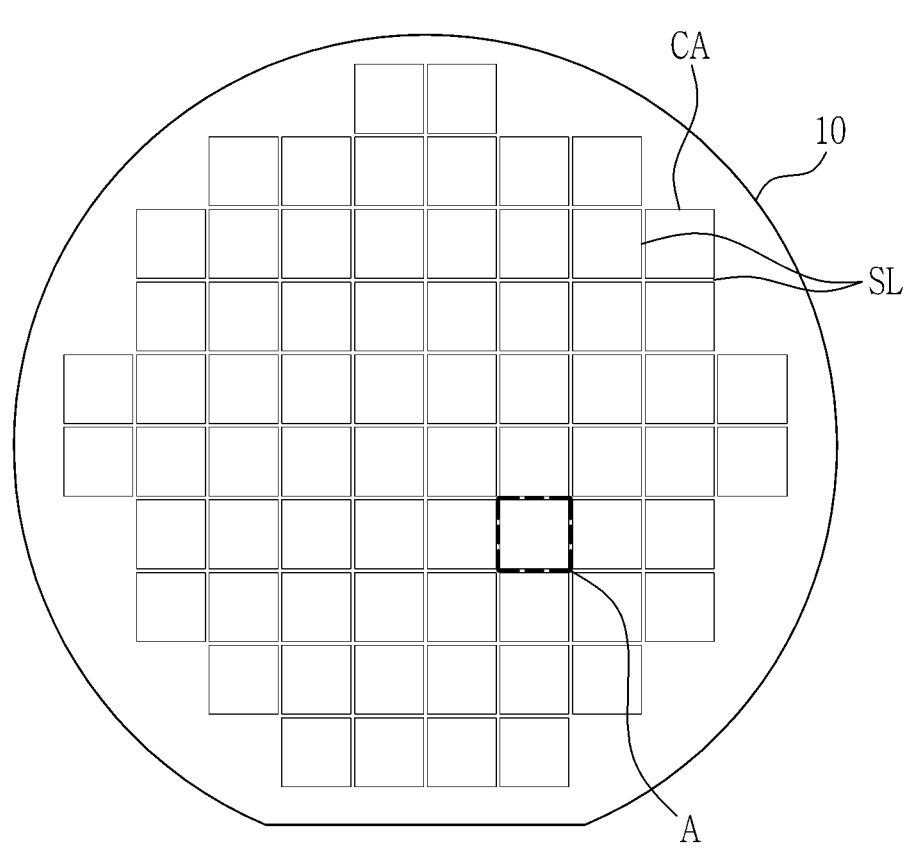
FIG. 1 is a top plan view of a semiconductor device according to an embodiment.

Hereinafter, various embodiments will be described in detail with reference to the accompanying drawings, and thus a person of an ordinary skill can easily perform the present invention in the technical field to which the present invention belongs. As those skilled in the art would realize, the described embodiments may be modified in various different ways, all without departing from the spirit or scope of the present invention. It is noted that aspects described with respect to one embodiment may be incorporated in different embodiments although not specifically described relative thereto. That is, all embodiments and/or features of any embodiments can be combined in any way and/or combination.

The drawings and description are to be regarded as illustrative in nature and not restrictive. Like reference numerals designate like elements throughout the specification.

In addition, because the size and thickness of each component shown in the drawing are arbitrarily indicated for better understanding and ease of description, the present invention is not necessarily limited to the drawings.

Throughout the specification, when it is described that an element is "connected" to another element, it includes not only a case that it is "directly connected" but also a case that it is "indirectly connected" through another member. In addition, unless explicitly described to the contrary, the word "comprise", and variations such as "comprises" or "comprising", will be understood to imply the inclusion of stated elements but not the exclusion of any other elements.

It will be understood that when an element, such as a layer, film, region, or substrate is referred to as being "on" another element, it can be directly on the other element or intervening elements may also be present. In contrast, when an element is referred to as being "directly on" another element, there are no intervening elements present. It will be understood that when an element, such as a layer, film, region, or substrate is referred to as being "on" another element, it can be directly on the other element or intervening elements may also be present.

Further, throughout the specification, the phrase "on a plane" means viewing a target portion from the top or in a plan view, and the phrase "on a cross-section" means viewing a cross-section formed by vertically cutting a target portion from the side.

Hereinafter, a semiconductor device according to an embodiment will be described with reference to the drawings.

Figure 2:
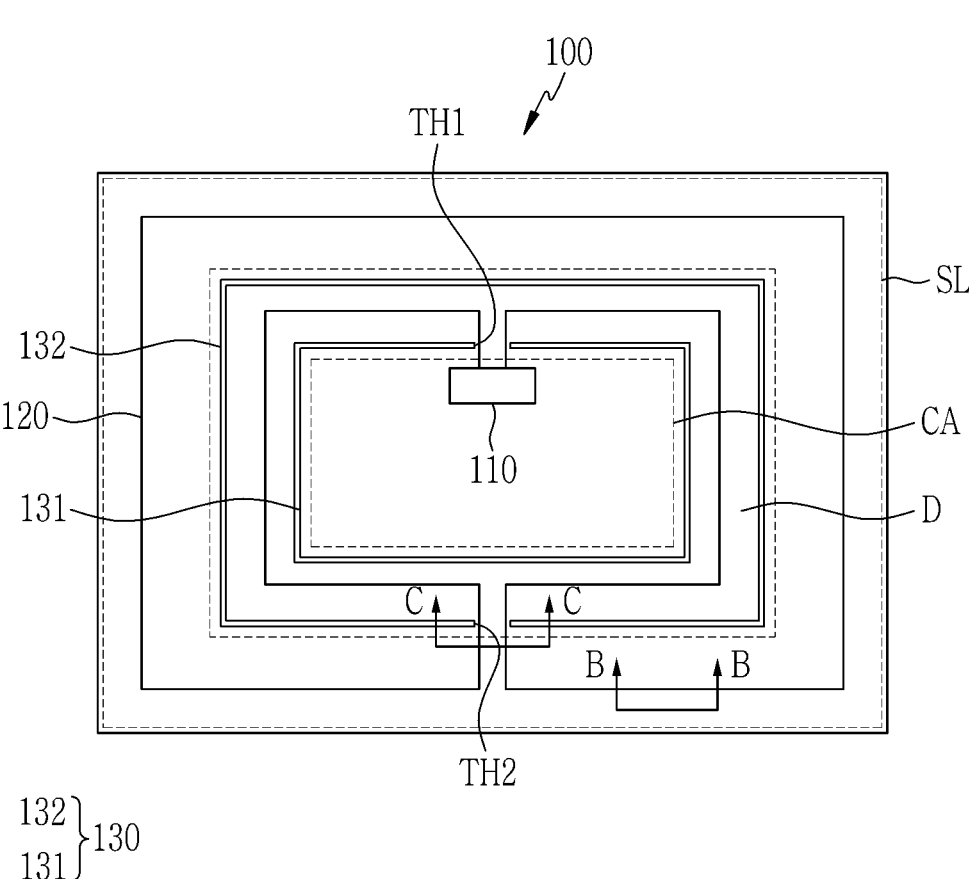
FIG. 2 is a top plan view of the semiconductor device according to the embodiment.
Figure 3:
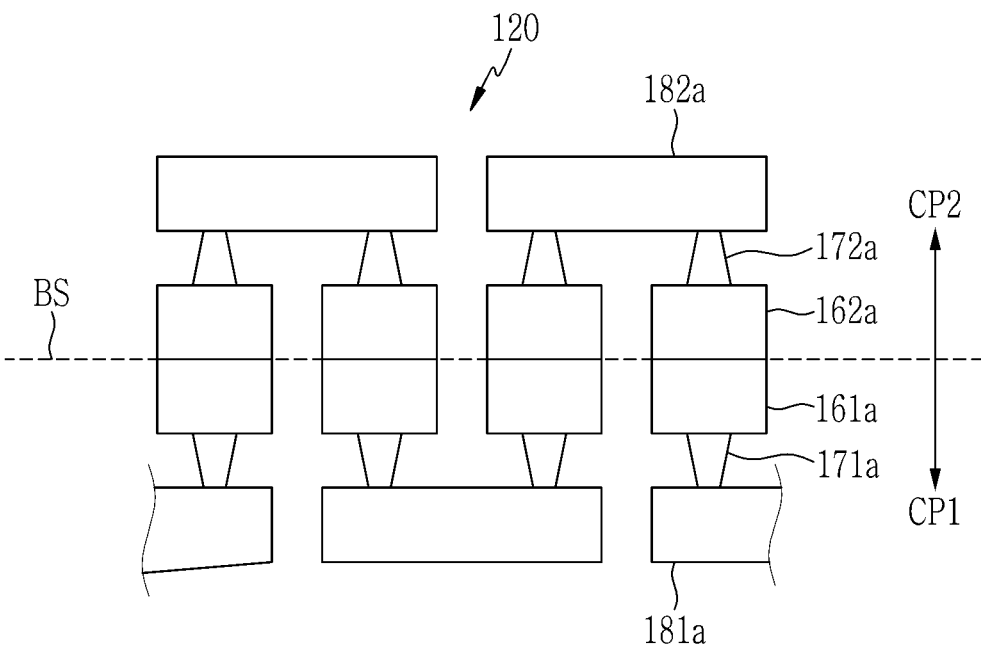
FIG. 3 is a cross-sectional view of the semiconductor device of FIG. 2, taken along the B-B direction.
Figure 4:
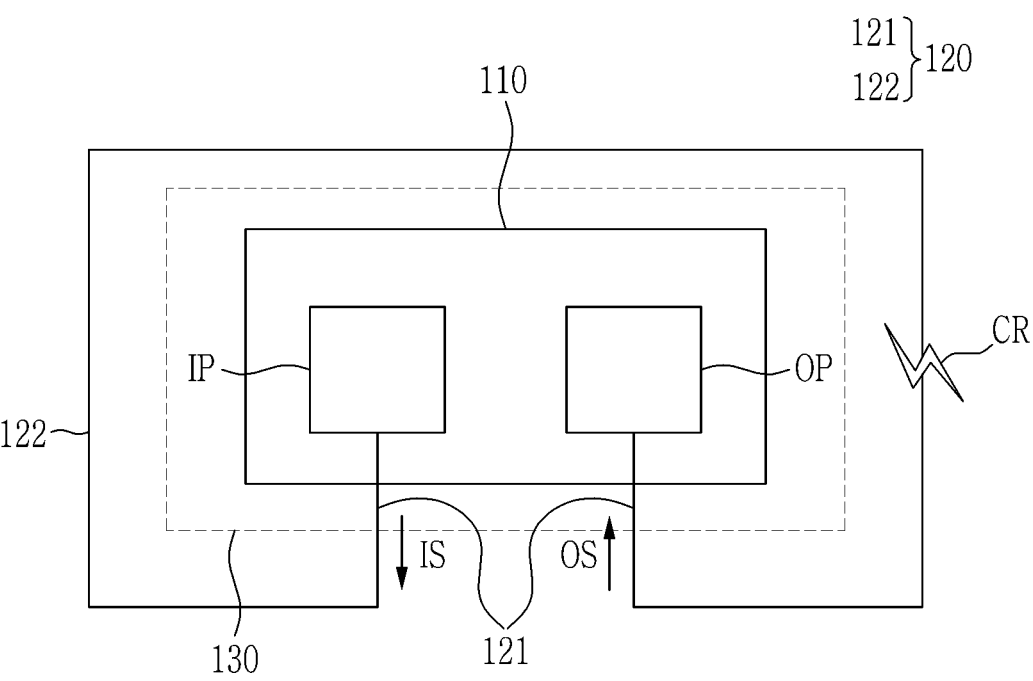
FIG. 4 is a diagram illustrating operation of a detection circuit portion of the semiconductor device according to the embodiment.
Figure 5:
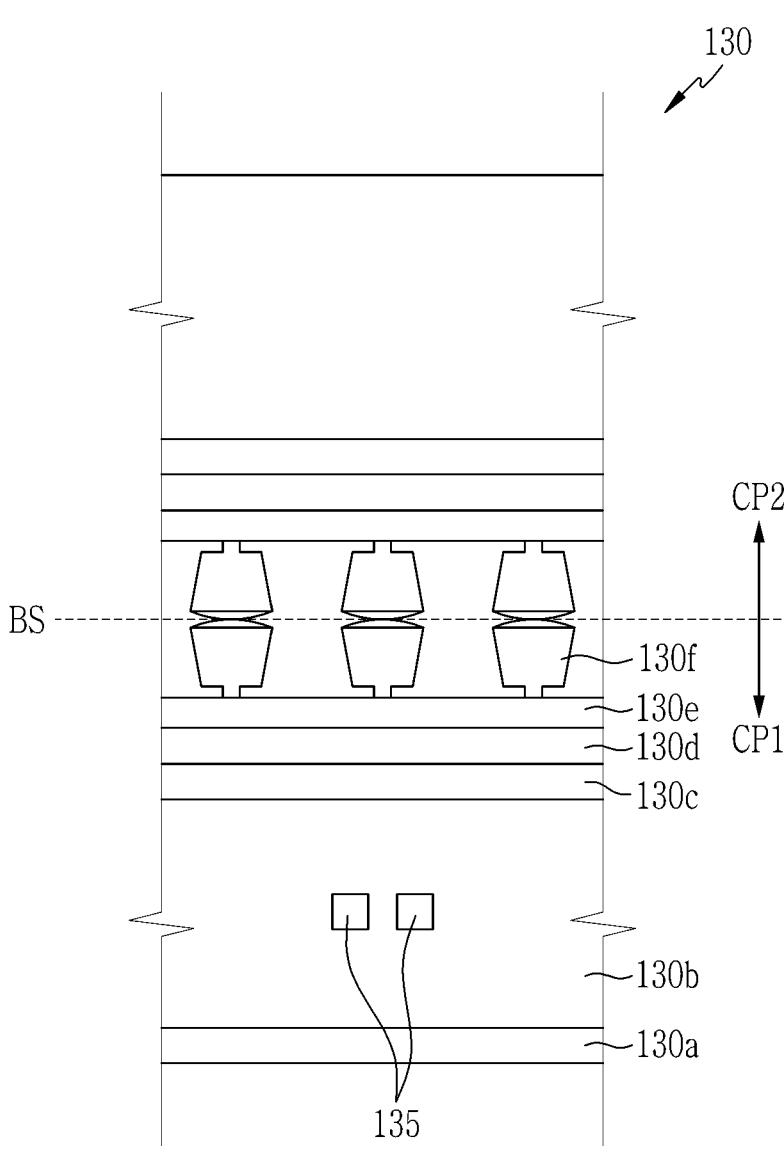
FIG. 5 is a cross-sectional view of FIG. 2, taken along the C-C direction.
Figure 6:
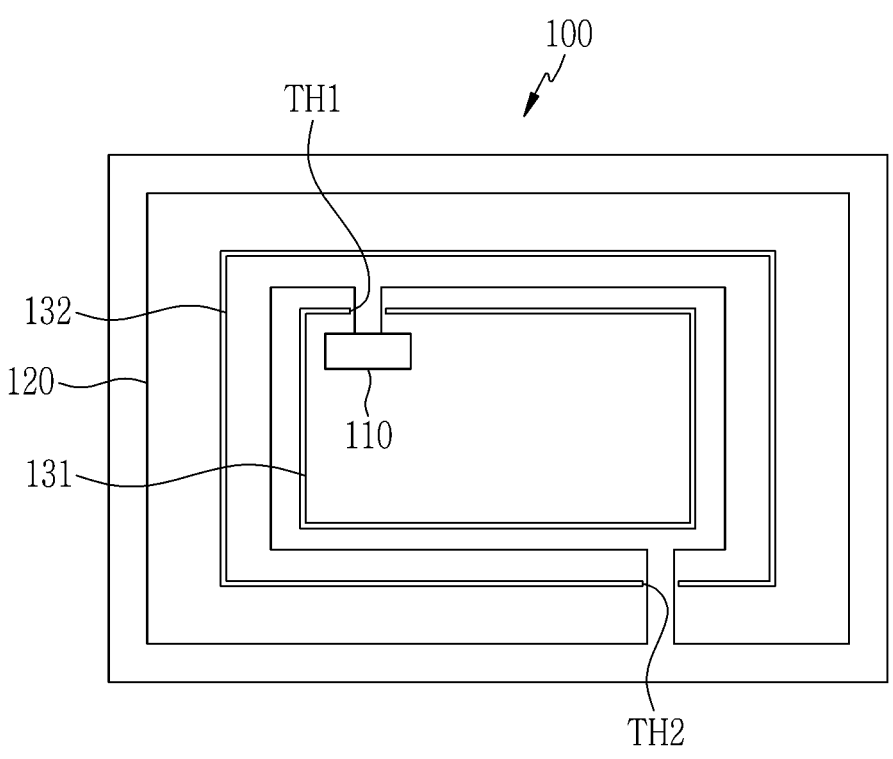
FIG. 6 to FIG. 11 are top plan views of a semiconductor device according to various embodiments.

FIG. 1 is a top plan view of a semiconductor device according to an embodiment, and FIG. 2 is a top plan view of the semiconductor device according to the embodiment. FIG. 3 is a cross-sectional view of the FIG. 2, taken along the B-B direction, FIG. 4 is a diagram illustrating operation of a detection circuit portion of the semiconductor device according to the embodiment, and FIG. 5 is a cross-sectional view of FIG. 2, taken along the C-C direction. The drawings are schematically shown for convenience of understanding.

In FIG. 1, a wafer 10 in a process of manufacturing a semiconductor device according to an embodiment is shown. On the wafer 10, a plurality of chip areas CA and scribe lanes SL surrounding them in the plan view are formed, and the chip areas 10 can be divided into a plurality of semiconductor dies by cutting (sawing) along the scribe lanes SL.

According to an embodiment, the semiconductor device may be implemented by a plurality of the wafers 10, which are combined by a bonding method. Accordingly, the semiconductor device of the embodiment may have a structure in which a plurality of chips (or a plurality of wafers) are bonded and stacked.

In FIG. 2, the semiconductor device 100 according to an embodiment, is illustrated as an enlarged view of part A of FIG. 1.

Referring to FIG. 2, the semiconductor device 100 includes a chip area CA, a scribe lane SL at the circumference of the chip area CA, a detection wire 120 extending from the chip area CA to a scribe lane SL, and a detection circuit portion 110 electrically connected to the detection wire 120 and disposed in the chip area CA. As shown in FIG. 2, according to an embodiment, a dam area D may be further included between the chip area CA and the scribe lane SL. The dam area D is a region that separates the chip area CA and the scribe lane SL, and the shape on the plane may be a ring shape or a closed curved line shape. The chip area CA and the scribe lane SL may be defined by the dam area D. In the dam area D, a dam structure 130 including at least one dam can be positioned.

The chip area CA is a region in which a plurality of elements operating in an actual chip are disposed. The shape of the chip area CA on a plane may be a quadrangle. For example, the planar shape of chip area CA may be defined by four sides perpendicular to each other, but is not limited thereto. The chip area CA may include a detection circuit portion 110 to be described later.

The scribe lane SL is a part surrounding the chip area CA in the plan view, and has a space margin in consideration of a part that may be damaged when the wafer 10 is diced into chips. The scribe lane SL may have a ring shape, for example, a square ring shape corresponding to the shape of the chip area CA.

In the scribe lane SL, various patterns, for example, mark patterns, key patterns, patterns for process monitoring or device testing, and the like may be formed.

According to an embodiment, the scribe lane SL may include a bonding metal pattern formed of bonding metals 161a and 162a (refer to FIG. 3) for bonding a plurality of chips. A detection wire 120, which will be described below, may be disposed on the scribe lane SL, and the above-described bonding metal pattern may form the detection wire 120.

For example, the semiconductor device 100 may have a structure in which a first chip CP1 and a second chip CP2, positioned on top of the first chip CP1, are coupled to each other. In FIG. 3 and FIG. 5, a bonding surface where the first chip CP1 and the second chip CP2 are bonded is marked as BS. Referring to FIG. 3, in the scribe lane SL, the first chip CP1 may have a first bonding metal pattern, and the second chip CP2 may have a second bonding metal pattern. In this case, the first bonding metal pattern and the second bonding metal pattern are bonded to each other, such that the first chip CP1 and the second chip CP2 may be bonded to each other. When the first bonding metals 161a forming the first bonding metal pattern and the second bonding metal 162a forming the second bonding metal pattern are not normally connected due to cracks and/or problems in the process, an electrical signal is not transmitted to the detection wire 120 disposed on the scribe lane SL, or an electrical signal is abnormal in some manner. According to an embodiment, the presence of a defect in the scribe lane SL may be detected using an electrical signal carried on the detection wire 120 disposed in the scribe lane SL.

Referring to FIG. 3, the detection wire 120 disposed in the scribe lane SL may include first and second bonding metals 161a and 162a, first and second detection wire structures 181a and 182a electrically connected with to detection circuit portion 110, and first and second contact plugs 171a and 172a connecting the wire structures 181a and 182a to the first and second bonding metal patterns 161a and 162a, respectively. For electrical connection between the detection circuit portion 110 and the first and second bonding metal patterns 161a and 162a, at least one of the first and second detection wire structures 181a and 182a may be connected to a connection wiring structure (not shown) extending from the cell area AC to the scribe lane SL. For example, the connection wiring structure described above may penetrate or extend into the dam structure 130. In this case, the connection wiring structure penetrating or extending into the dam structure 130 may be formed to be insulated from the dam structure 130.

The dam structure 130 is a part that divides the chip area CA and the scribe lane SL, and surrounds the chip area CA in a plan view to separate the chip area CA and the scribe lane SL, thereby defining the chip area CA and the scribe lane SL. The dam structure 130 vertically penetrates or extends into the first chip CP1 and the second chip CP2 to separate the chip area CA and the scribe lane SL. The dam structure 130 may serve to block cracks generated in the scribe lane SL from progressing to the chip area CA. In addition, the dam structure 130 may serve to block external moisture from entering the chip area CA.

According to an embodiment, the dam structure 130 may include at least one dam. For example, the dam structure 130 may include an inner dam 131 adjacent to the chip area CA and surrounding the chip area CA in a plan view, and an outer dam 132 surrounding the inner dam 131 in a plan view toward the scribe lane SL side. The inner dam 131 and the outer dam 132 may be spaced apart at a predetermined interval and disposed side by side. The inner dam 131 and the outer dam 132 may have a rectangular ring shape corresponding to the shape of the chip area CA on a plane.

The dam structure 130 includes a through portion through which the detection wire 120 passes. According to an embodiment, at least one dam forming the dam structure 130 includes a through portion. For example, referring to FIG. 2, the inner dam 131 may have a first through portion TH1, and the outer dam 132 may have a second through portion TH2. The detection line 120 drawn out from the detection circuit portion 110 of the chip area CA passes through the first through portion TH1, and the detection line 120 extending through the first through portion TH1 may pass through the second through portion TH2 and extend to the scribe lane SL.

Referring to FIG. 5, the dam structure 130 may include a first gate pattern 130a, a first contact plug 130b, first wiring 130c, a second contact plug 130d, second wiring 130e, and a bonding metal 130f, and the bonding metals of the first and second chips CP1 and CP2 may be connected to each other.

Referring to FIG. 5, the through portion of the dam structure 130 may include a through hole 135. According to an embodiment, the detection wire 120 may pass through the through hole 135 and extend from the chip area CA to the scribe lane SL. For example, a connection wiring structure (not shown) extending from the chip area CA and passing through the through hole 135 is connected to the first and second detection wire structures 181a and 182a disposed on the scribe lane SL, and thus an electrical signal carried via the detection wire 120 may pass through the dam structure 130.

Meanwhile, FIG. 5 shows an example form in which the through hole 135 is formed in the dam structure of the first chip CP1, but embodiments are not limited thereto, and the through hole 135 may be formed in the dam structure of the second chip CP2. In addition, FIG. 5 shows a form with two through holes 135, but embodiments are not limited thereto, and one through hole 135 or three or more through holes 135 may be formed in other embodiments. In addition, as another form, the through hole 135 may be formed not in the dam structure, but in an area around a portion where the bonding metals of the first and second chips CP1 and CP2 are bonded.

The detection wire 120 is electrically connected to the detection circuit portion 110 disposed in the chip area CA, and extends from the chip area CA to the scribe lane SL through the dam structure 130.

Referring to FIG. 4, the detection wire 120 may include an extension portion 122 extending to surround the dam structure 130 in a plan view, and a connection portion 121 passing through the dam structure 130 and connecting the detection circuit portion 110 and the extension portion 122. According to an embodiment, the extension portion 122 may be disposed in a form surrounding the dam structure 130 along the scribe lane SL in a plan view.

Accordingly, defects in the scribe lane SL may be detected.

The detection circuit portion 110 may include a signal providing portion IP and a signal receiving portion OP. The signal providing portion IP may generate an input signal and apply it to the detection wire 120, and the signal receiving portion OP may receive an output signal from the detection wire 120. The output signal may be stored inside the detection circuit portion 110 or output to the outside. Accordingly, a defect in the scribe lane SL may be detected using the detection wire 120 disposed to the scribe lane SL. As will be described below, in another embodiment, an input signal may be input through a pad connected to the outside, not inside the detection circuit portion, and an output signal may also be output to the outside. The input signal may include a pulse, a signal, and/or a DC voltage, but embodiments are not limited thereto. In addition, the input signal may be used to detect not only the presence or absence of defects but also the type, position, and degree of defects according to an arrival voltage of the output signal, a difference in arrival time, for example, in the case of a pulse signal, and/or differences in pulse width and pulse height, by using a signal that uses both the time axis and the voltage axis, but embodiments are not limited thereto.

FIG. 6 to FIG. 11 are top plan views of a semiconductor device according to various embodiments. Hereinafter, the semiconductor device 100 according to various embodiments will be described along with drawings.

According to an embodiment, one or both of the first through portion TH1 of the inner dam 131 and the second through portion TH2 of the outer dam 132 may be disposed adjacent to one vertex of the rectangular ring shape dam structure. In addition, according to an embodiment, the first through portion TH1 of the inner dam 131 and the second through portion TH2 of the outer dam 132 may be disposed at opposite corner sides of the square ring-shaped dam structure. For example, referring to FIG. 6, the first through portion TH1 of the inner dam 131 and the second through portion TH2 of the outer dam 132 may be disposed at positions adjacent to the vertices of the diagonal directions of opposite corners, respectively. As described above, the dam structure 130 may serve to block external moisture from entering the chip area CA, and there is a possibility that external moisture may inflow through the through portion of the dam structure 130. When the first through portion TH1 of the inner dam 131 and the second through portion TH2 of the outer dam 132 are respectively disposed at positions adjacent to the vertices of the diagonal directions of opposite corners, a route from the second through portion TH2 to the first through portion TH1 for moisture inflow becomes longer, and accordingly the possibility of moisture inflow can be suppressed.

Figure 7:
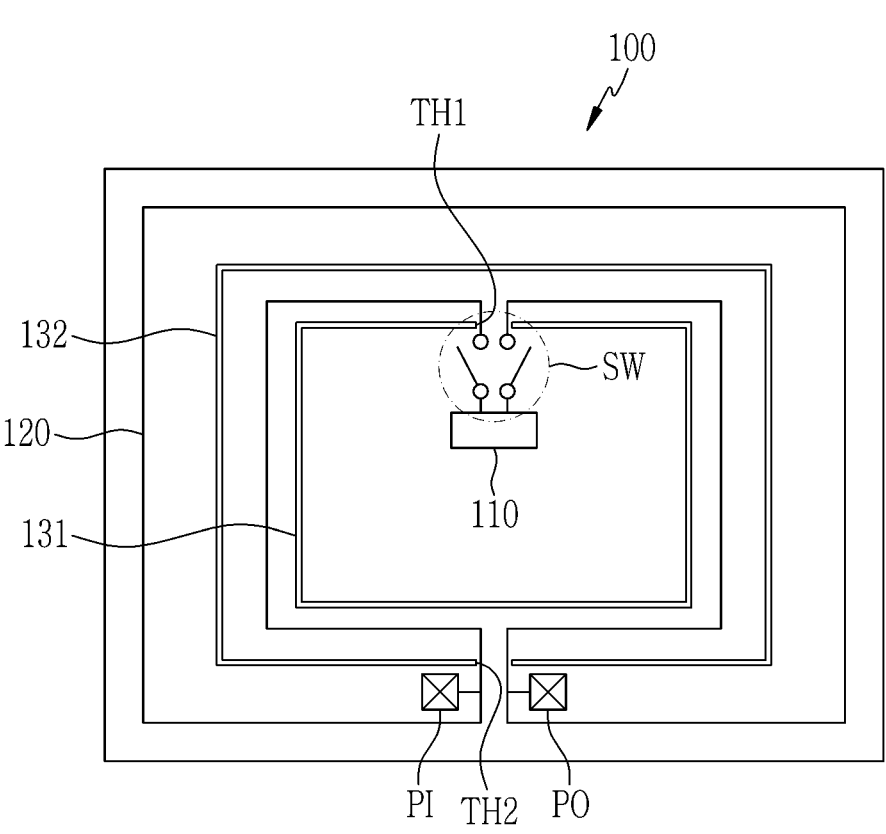

Referring to FIG. 7, the detection circuit portion 110 may include a switch SW that is operable to disconnect the detection circuit portion 110 from the detection wire 120. Accordingly, the electrical connection between the detection circuit portion 110 and the detection wire 120 may be ON/OFF controlled through the switch SW. In the present embodiment, detection pads PI and PO may be included on one side and the other side of the detection wire 120, respectively. For example, in a state in which the connection between the detection circuit portion 110 and the detection wire 120 is blocked or disconnected by opening the switch SW, an input signal may be applied to the input pad PI through an external circuit (not shown), and then may be output to the outside through the output pad PO. Accordingly, defects of the scribe lane SL can be detected even when the detection circuit portion 110 of the chip area CA does not operate, i.e., is electrically isolated by the switch SW.

Figure 8:
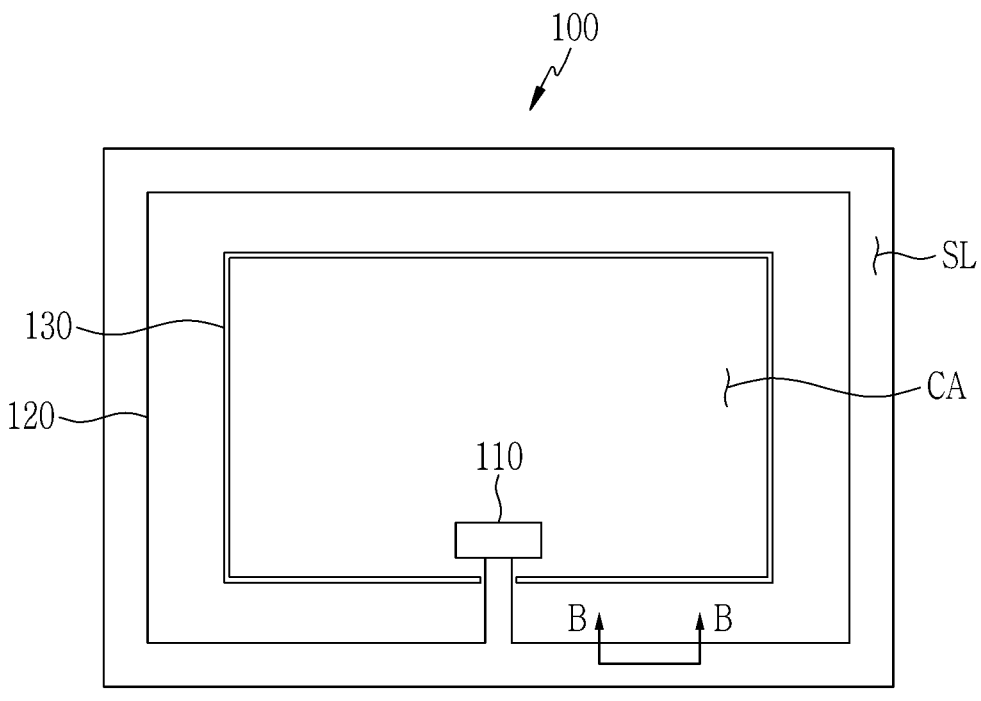

Referring to FIG. 8, the dam structure 130 may include only one dam. In the case of including only one dam, a space of the chip area CA may be expanded compared to the case of including a plurality of dams.

Figure 9:
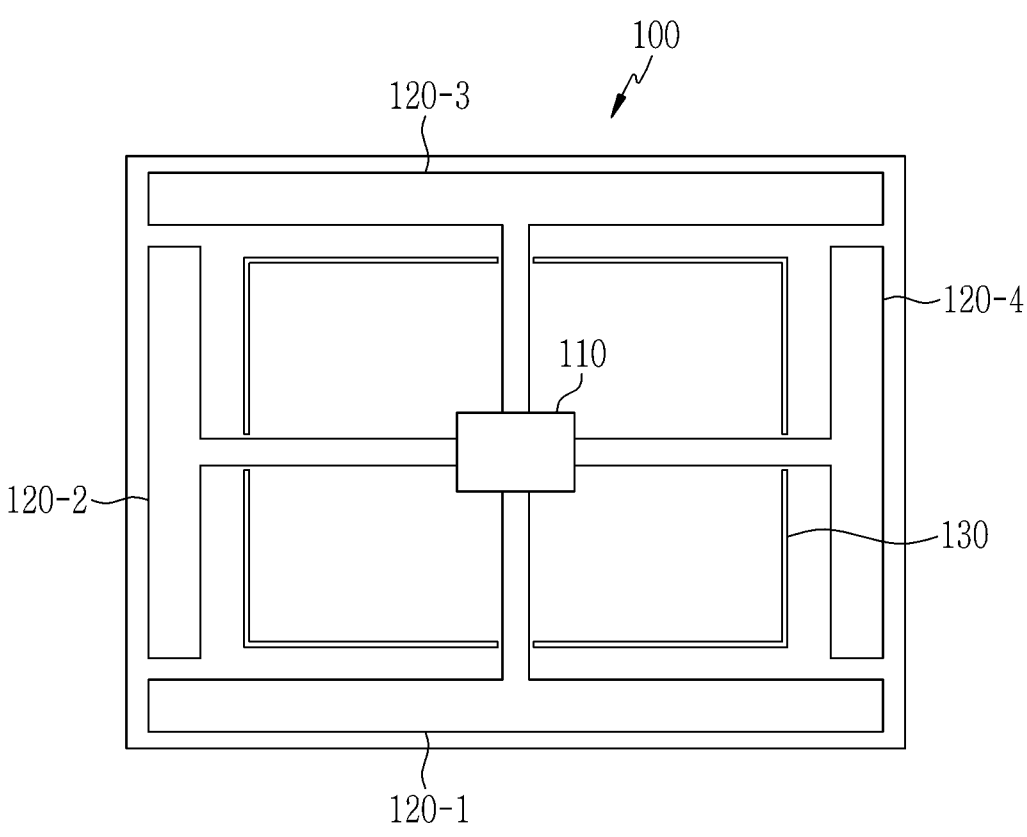

Referring to FIG. 9, the detection wire 120 may include a plurality of detection wires 120-1, 120-2, 120-3, and 120-4 passing through each corner of the dam structure. In this case, a plurality of detection wires 120-1, 120-2, 120-3, and 120-4 may be electrically separated from each other. Accordingly, the defect position in the scribe lane SL may be confirmed through output signals from the plurality of detection wires 120-1, 120-2, 120-3, and 120-4.

Figure 10:
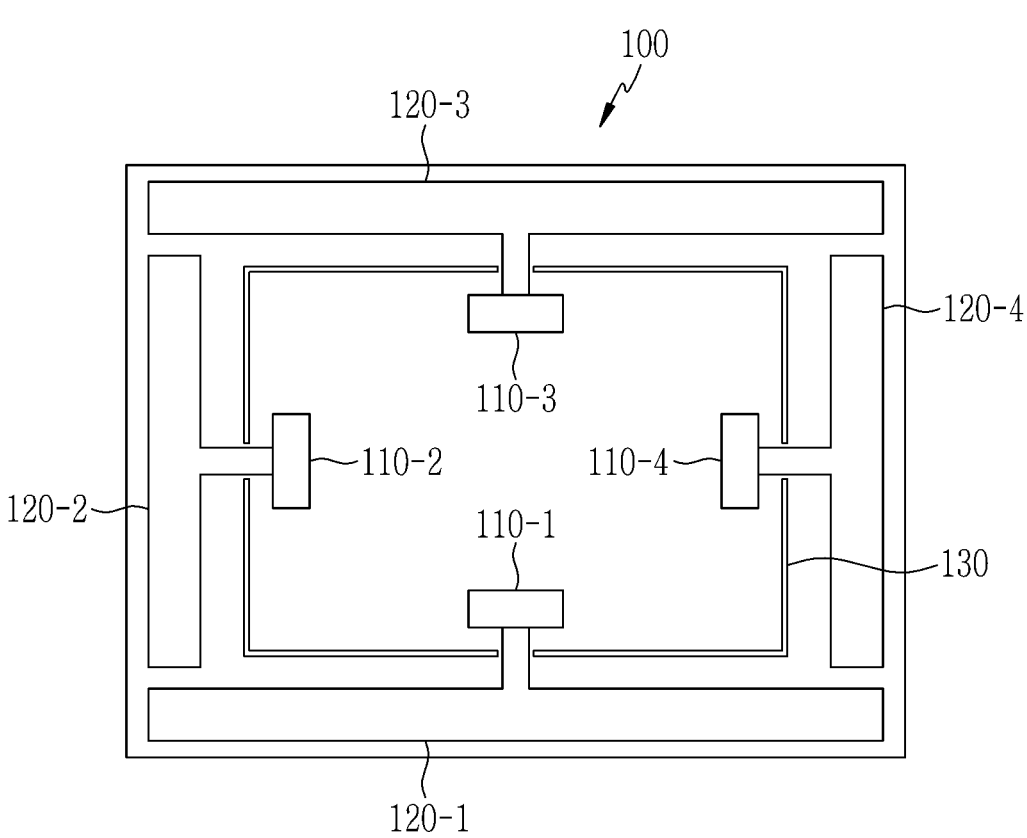
Figure 11:
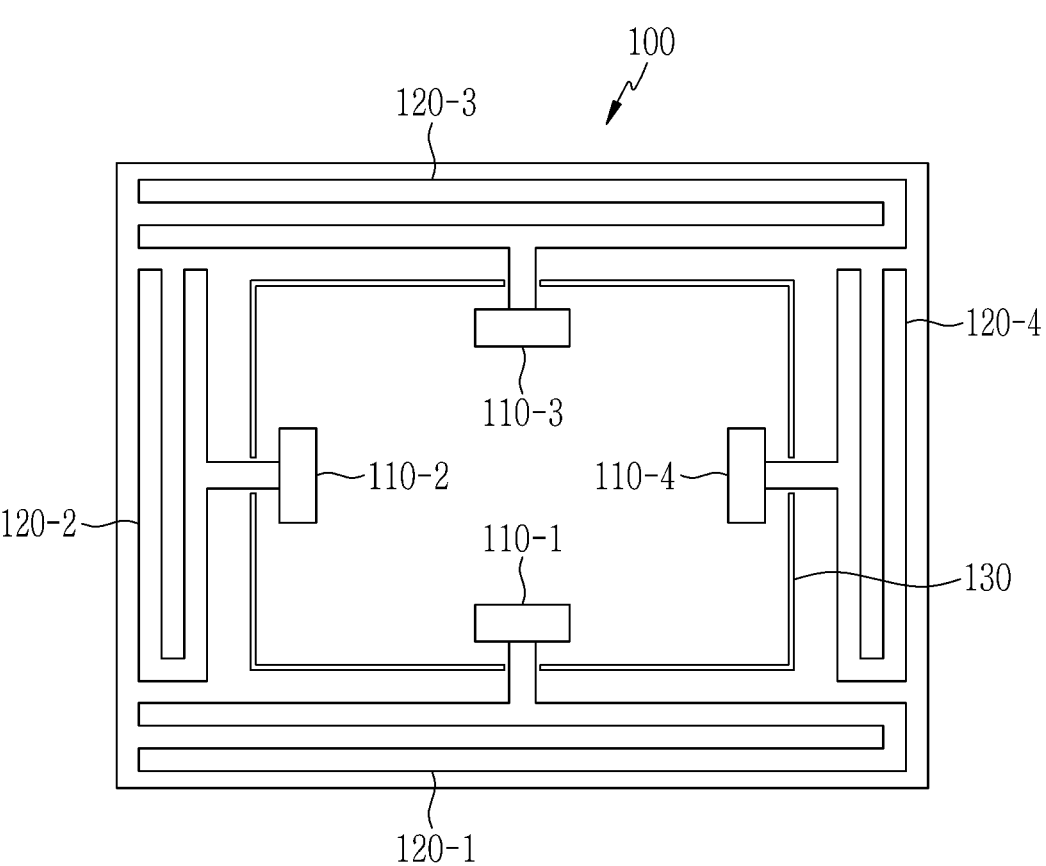

Referring to FIG. 10 and FIG. 11, the detection circuit portion 110 includes a plurality of detection circuits 110-1, 110-2, 110-3, and 110-4, and may be electrically connected to the plurality of detection wires 120-1, 120-2, 120-3, and 120-4 electrically isolated from each other. In addition, each of the plurality of detection wires 120-1, 120-2, 120-3, and 120-4 may be arranged in various patterns that are bent multiple times.

In FIG. 8 to FIG. 11, it is illustrated that the dam structure 130 includes only one dam, but embodiments are not limited thereto, and the same configuration may be used even when the dam structure 130 includes a plurality of dams.

Figure 12:
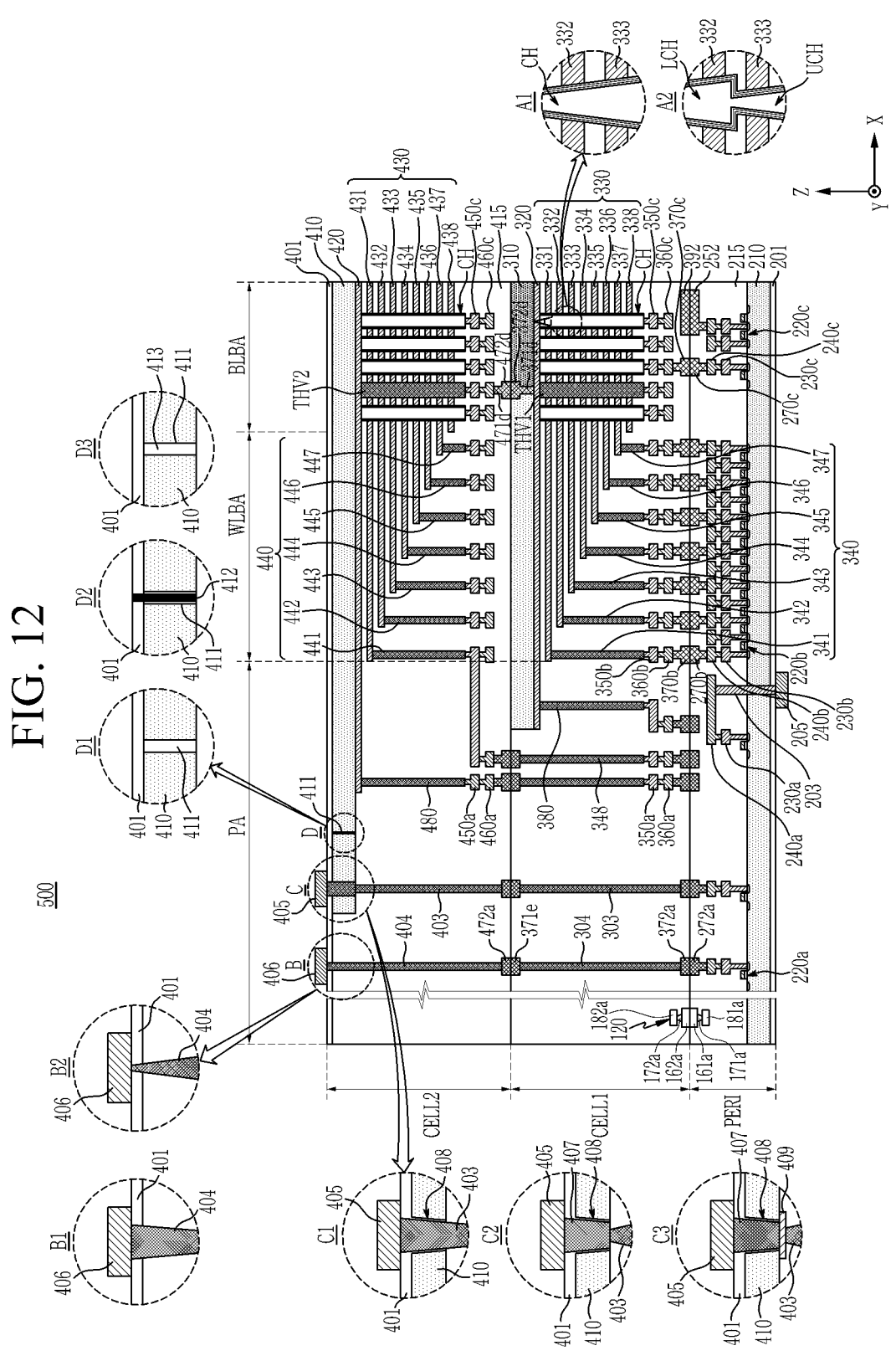
FIG. 12 is a cross-sectional view of an example in which an embodiment is applied to a bonding VNAND.

The embodiments described above may be applied to a vertical NAND flash memory (hereinafter, bonding VNAND, memory device) in which an upper chip and a lower chip are connected by a bonding method. However, embodiments are not limited thereto, and may be applied to multi-die, chiplet-type semiconductor devices. Hereinafter, an example in which the embodiment is applied to the bonding VNAND will be described. FIG. 12 is a cross-sectional view of a case in which the embodiment is applied to the bonding VNAND.

Referring to FIG. 12, a memory device 500 may have a C2C (chip to chip) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in a lowermost metal layer of the upper chip to a bonding metal pattern formed in an uppermost metal layer of the lower chip. For example, in an example in which the bonding metal patterns are formed of copper (Cu), the bonding method may be a Cu—Cu bonding method. In other embodiments, the bonding metal patterns may be formed of aluminum (Al) or tungsten (W).

The memory device 500 may include at least one upper chip including the cell region. For example, as illustrated in FIG. 12, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on an orientation before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 12. However, embodiments of the inventive concepts are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in the present embodiments. However, embodiments of the inventive concepts are not limited thereto. In certain embodiments, at least one or more additional metal lines may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulation layer 215 may be disposed on the first substrate 210 and may include an insulating material, such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate or extend into the word lines 330, the string selection lines, and the ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate or extend into the common source line 320 and lower word lines 331 and 332. The lower channel LCH may include a data storage layer, a channel layer, and a filling insulation layer and may be connected to the upper channel UCH. The upper channel UCH may penetrate or extend into upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH, which are formed by processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. In some embodiments, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it may be possible to reduce an influence of a non-uniform channel width between the lower and upper channels LCH and UCH on an operation of the memory device.

Meanwhile, the number of the lower word lines 331 and 332 penetrated by the lower channel LCH is less than the number of the upper word lines 333 to 338 penetrated by the upper channel UCH in the region 'A2'. However, embodiments of the inventive concepts are not limited thereto. In certain embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 12, the first through-electrode THV1 may penetrate or extend into the common source line 320 and the plurality of word lines 330. In certain embodiments, the first through-electrode THV1 may further penetrate or extend into the second substrate 310. The first through-electrode THV1 may include a conductive material. In some embodiments, the first through-electrode THV1 may include a conductive material at least partially surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472d. The first through-metal pattern 372d and the second through-metal pattern 472d may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to a page buffer included in the peripheral circuit region PERI. For example, some of the circuit elements 220c of the peripheral circuit region PERI may constitute the page buffer, and the bit line 360c may be electrically connected to the circuit elements 220c constituting the page buffer through an upper bonding metal pattern 370c of the first cell region CELL1 and an upper bonding metal pattern 270c of the peripheral circuit region PERI.

Referring continuously to FIG. 12, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350b and second metal lines 360b may be sequentially connected onto the cell contact plugs 340 connected to the word lines 330. In the word line bonding region WLBA, the cell contact plugs 340 may be connected to the peripheral circuit region PERI through upper bonding metal patterns 370b of the first cell region CELL1 and upper bonding metal patterns 270b of the peripheral circuit region PERI.

The cell contact plugs 340 may be electrically connected to a row decoder included in the peripheral circuit region PERI. For example, some of the circuit elements 220b of the peripheral circuit region PERI may constitute the row decoder, and the cell contact plugs 340 may be electrically connected to the circuit elements 220b constituting the row decoder through the upper bonding metal patterns 370b of the first cell region CELL1 and the upper bonding metal patterns 270b of the peripheral circuit region PERI. In some embodiments, an operating voltage of the circuit elements 220b constituting the row decoder may be different from an operating voltage of the circuit elements 220c constituting the page buffer. For example, the operating voltage of the circuit elements 220c constituting the page buffer may be greater than the operating voltage of the circuit elements 220b constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370b may be formed in the first cell region CELL1, and the upper bonding metal patterns 270b may be formed in the peripheral circuit region PERI. The upper bonding metal patterns 370b of the first cell region CELL1 and the upper bonding metal patterns 270b of the peripheral circuit region PERI may be electrically connected to each other by the bonding method. The upper bonding metal patterns 370b and the upper bonding metal patterns 270b may be formed of aluminum, copper, or tungsten.

In the external pad bonding region PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by the bonding method in the external pad bonding region PA. Likewise, an upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by the bonding method.

Common source line contact plugs 380 and 480 may be disposed in the external pad bonding region PA. The common source line contact plugs 380 and 480 may be formed of a conductive material, such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2.

Input/output pads 205, 405, and 406 may be disposed in the external pad bonding region PA. Referring to FIG. 12, a lower insulating layer 201 may be on and at least partially cover a bottom surface of the first substrate 210, and a first input/output pad 205 may be formed on the lower insulating layer 201. The first input/output pad 205 may be connected to at least one of a plurality of the circuit elements 220a disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulation layer 401 on and at least partially covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220a disposed in the peripheral circuit region PERI through second input/output contact plugs 403 and 303, and the third input/output pad 406 may be connected to at least one of the plurality of circuit elements 220a disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate or extend into an interlayer insulating layer 415 of the second cell region CELL2 to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively smaller toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 132', the third input/output contact plug 404 may extend in the third direction (e.g., the Z-axis direction), and a diameter of the third input/output contact plug 404 may become progressively smaller toward the upper insulating layer 401. In other words, like the channel structure CH, the diameter of the third input/output contact plug 404 may become progressively smaller toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410. For example, as illustrated in a region 'C', the second input/output contact plug 403 may penetrate or extend into the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as illustrated in a region 'C1', an opening 408 may be formed to penetrate or extend into the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments of the inventive concepts are not limited thereto, and in certain embodiments, the diameter of the second input/output contact plug 403 may become progressively smaller toward the second input/output pad 405.

In certain embodiments, as illustrated in a region 'C2', the opening 408 penetrating or extending into the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively smaller toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments, as illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. In other embodiments, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively smaller toward the lower metal pattern 371e or may become progressively greater toward the lower metal pattern 371e.

Meanwhile, in some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. In other embodiments, the second input/output pad 405 may be located between the slit 411 and the cell contact plugs 440 when viewed in a plan view.

In some embodiments, as illustrated in a region 'D1', the slit 411 may be formed to penetrate or extend through the third substrate 410. For example, the slit 411 may be used to prevent or suppress the third substrate 410 from being finely cracked when the opening 408 is formed. However, embodiments of the inventive concepts are not limited thereto, and in certain embodiments, the slit 411 may be formed to have a depth ranging from about 60% to about 70% of a thickness of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Because the insulating material 413 is formed in the slit 411, it is possible to prevent or reduce the likelihood of a voltage provided through the second input/output pad 405 from affecting a metal layer disposed on the third substrate 410 in the word line bonding region WLBA.

Meanwhile, in certain embodiments, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer on and at least partially covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 on and at least partially covering a top surface of the common source line 420 or a conductive layer for connection may be formed.

Meanwhile, referring to FIG. 12, the memory device 500 may include the detection wire 120 according to the embodiment described above. The detection wire 120 includes the first bonding metal 161a of the lower chip including the peripheral circuit region PERI, and the second bonding metal 162a of the first upper chip including the first cell region CELL1, thereby facilitating detection of bonding defects between the lower chip and the first upper chip. Although not shown in FIG. 12, a dam structure may be further included in the adjacent portion of the detection wire 120, and a connection wiring structure that is connected to the first and second detection wire structures 181a and 182a and connected to the circuit element serving as a detection circuit portion 110 passing through the dam structure. FIG. 12 shows a case where the detection wire 120 detects a bonding defect between the first upper chip and the lower chip, but embodiments are not limited thereto, and may be configured to detect a bonding defect between the first upper chip and the second upper chip. In addition, embodiments may be configured to detect both a bonding defect between the first upper chip and the lower chip and a bonding defect between the first upper chip and the second upper chip.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10 wafer
100 semiconductor device
110 detection circuit portion
120 detection wire
130 dam structure

What is claimed is:

1. A semiconductor device with a structure in which a plurality of chips are stacked, comprising:

a chip area;

a scribe lane at a circumference of the chip area;

a dam structure that separates the chip area and the scribe lane;

a detection wire that extends from the chip area to the scribe lane by passing through the dam structure; and a detection circuit in the chip area that is electrically connected to the detection wire and is configured to detect a defect in the scribe lane.

2. The semiconductor device of claim 1, wherein the plurality of chips comprise:

a first chip having a first bonding metal pattern, and a second chip on the first chip and including a second bonding metal pattern corresponding to the first bonding metal pattern, and wherein the first chip and the second chip are bonded together by bonding the first bonding metal pattern and the second bonding metal pattern to each other.

3. The semiconductor device of claim 2, wherein in the scribe lane, the detection wire comprises the first bonding metal pattern and the second bonding metal pattern.

4. The semiconductor device of claim 3, wherein in the scribe lane, the detection wire comprises first and second detection wire structures on the first and second chips, respectively, and first and second contact plugs that connect the first and second detection wire structures to the first and second bonding metal patterns, respectively.

5. The semiconductor device of claim 4, wherein
the dam structure comprises a through hole, and
at least one of the first and second detection wire structures extends from the chip area and is connected to a connection wiring structure passing through the through hole.

6. The semiconductor device of claim 1, wherein
the detection wire extending into the scribe lane at least partially surrounds the dam structure in a plan view.

7. The semiconductor device of claim 1, wherein
the detection circuit comprises a switch that is configurable to control connection to the detection wire.

8. The semiconductor device of claim 7, wherein
detection pads are on one side and the other side of the detection wire, respectively.

9. The semiconductor device of claim 1, wherein
the dam structure includes an inner dam adjacent to the chip area and surrounding the chip area in a plan view, and an outer dam spaced parallel to the inner dam and surrounding the inner dam in the plan view, the outer dam being between the inner dam and the scribe lane.

10. The semiconductor device of claim 9, wherein
the inner dam comprises a first through portion through which the detection wire passes, and the outer dam comprises a second through portion through which the detection wire extending through the first through portion passes.

11. The semiconductor device of claim 10, wherein
the inner dam and the outer dam each have a rectangular ring shape, and
at least one of the first through portion and the second through portion is adjacent to one vertex of the rectangular ring shape.

12. The semiconductor device of claim 1, wherein
the detection circuit comprises a plurality of detection circuits,
the detection wire comprises a plurality of detection wires electrically separated from each other, and
the plurality of detection circuits are electrically connected to the plurality of detection wires, respectively.

13. The semiconductor device of claim 1, wherein
the dam structure has a square ring shape,
the detection wire comprises a plurality of detection wires passing through each corner side of the dam structure, and
the plurality of detection wires are electrically separated from each other.

14. A semiconductor device comprising:
a chip area including a detection circuit portion;
a scribe lane at a circumference of the chip area;
at least one dam between the chip area and the scribe lane; and
a detection wire that is electrically connected to the detection circuit portion, and extends from the chip area to the scribe lane by passing through the at least one dam.

15. The semiconductor device of claim 14, wherein the at least one dam between the chip area and the scribe lane separates the chip area and the scribe lane,
wherein the detection wire comprises
an extension portion extending along the scribe lane to surround the at least one dam in a plan view, and a connection portion passing through the at least one dam to connect the detection circuit portion and the extension portion.

16. The semiconductor device of claim 14, wherein
the detection circuit portion is configured to apply an input signal to the detection wire and is configured to receive an output signal from the detection wire to detect a defect in the scribe lane.

17. The semiconductor device of claim 16, wherein
the input signal comprises a pulse, a signal, and/or a DC voltage.

18. The semiconductor device of claim 14, wherein
the detection circuit portion comprises a switch that is configurable to cut off an electrical connection with the detection wire, and
the detection wire comprises an input pad configured to apply an input signal and an output pad configured to output an output signal.

19. The semiconductor device of claim 14, wherein
the scribe lane comprises a lower structure including a first bonding metal pattern that is combined with an upper structure including a second bonding metal pattern corresponding to the first bonding metal pattern, and
the detection wire comprises the first bonding metal pattern and the second bonding metal pattern.

20. A semiconductor device bonded with a plurality of wafers, comprising:
a chip area;
a scribe lane at a circumference of the chip area;
a dam structure between the chip area and the scribe lane, and including an inner dam in a form of a first square ring surrounding the chip area in a plan view and an outer dam in a form of a second square ring spaced at a predetermined distance from the inner dam in a direction of the scribe lane;
a detection wire extending from the chip area to the scribe lane through the dam structure; and
a detection circuit portion in the chip area and electrically connected to the detection wire,
wherein the detection circuit portion is configured to apply an input signal to the detection wire and is configured to detect a defect in the scribe lane using an output signal received through the detection wire; and
a first through portion through which the detection wire passes in the inner dam; and
a second through portion through which the detection wire passes in the outer dam,
wherein the first through portion and the second through portion are on opposite corner sides of the first and second square rings, respectively.

* * * * *